(12) United States Patent
Savage

(10) Patent No.: US 6,433,625 B1
(45) Date of Patent: Aug. 13, 2002

(54) NOISE REDUCTION AUTO PHASING CIRCUIT FOR SWITCHED CAPACITOR CIRCUITS

(75) Inventor: Scott C. Savage, Ft. Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/003,763

(22) Filed: Nov. 1, 2001

(51) Int. Cl.[7] .................................................. H03K 5/00
(52) U.S. Cl. ........................................................ 327/551
(58) Field of Search ................................. 327/551, 261, 327/311, 34, 178

(56) References Cited

U.S. PATENT DOCUMENTS 5,706,004 A * 1/1998 Yeung ........................ 341/122
5,973,553 A * 10/1999 Kim ........................... 327/551
6,201,431 B1 * 3/2001 Allen et al. ................. 327/551

* cited by examiner

Primary Examiner—Dinh T. Le

(57) ABSTRACT

An apparatus comprising a first circuit, a second circuit, and a third circuit. The first circuit may be configured to generate a control signal in response to an output signal. The control signal may comprise a peak value of the output signal. The second circuit may be configured to generate a phase adjustment signal in response to the control signal. The third circuit may be configured to generate a second clock signal in response to the phase adjustment signal and a first clock signal. The second clock signal may clock the output signal.

20 Claims, 3 Drawing Sheets

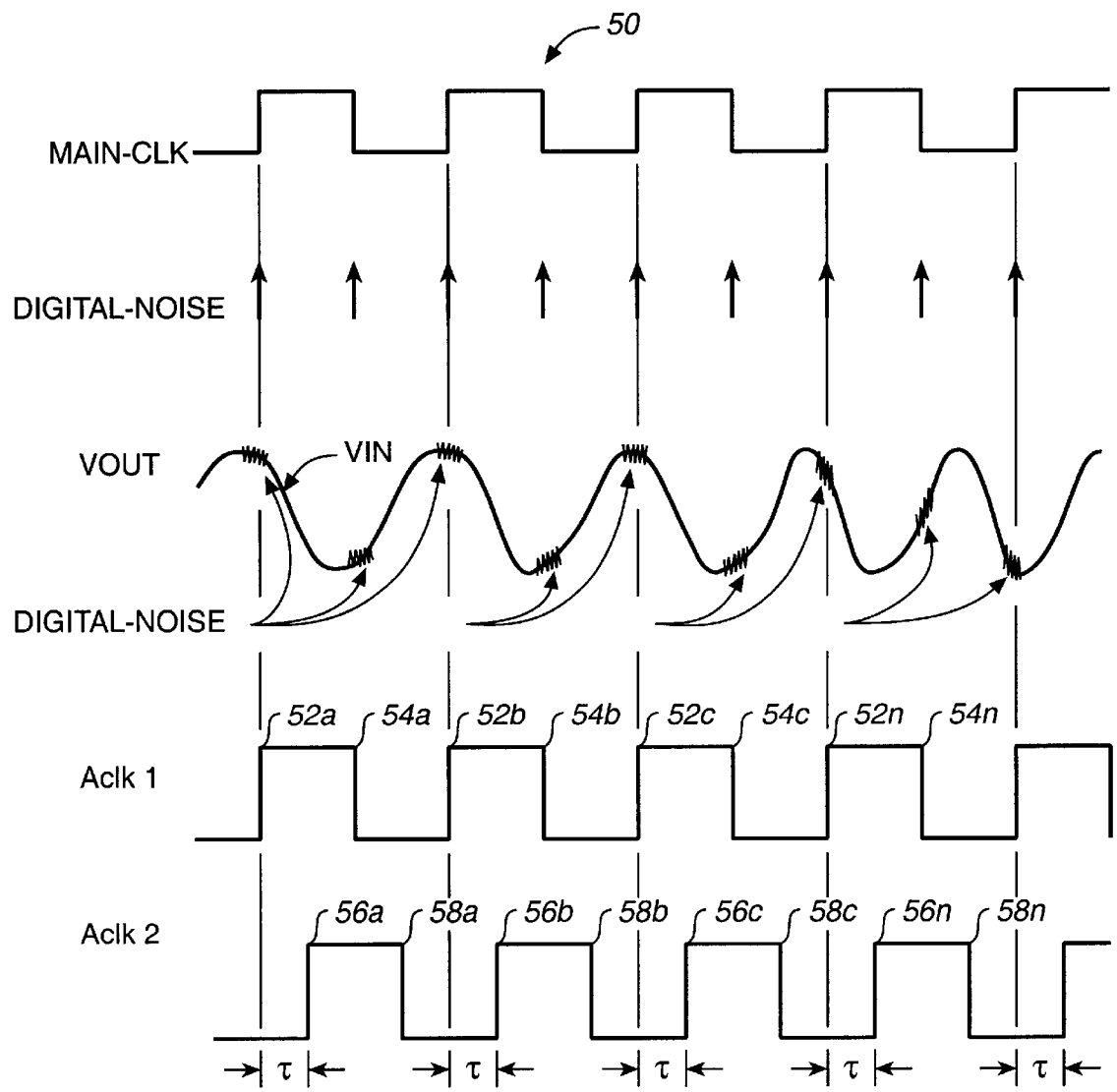
FIG._1

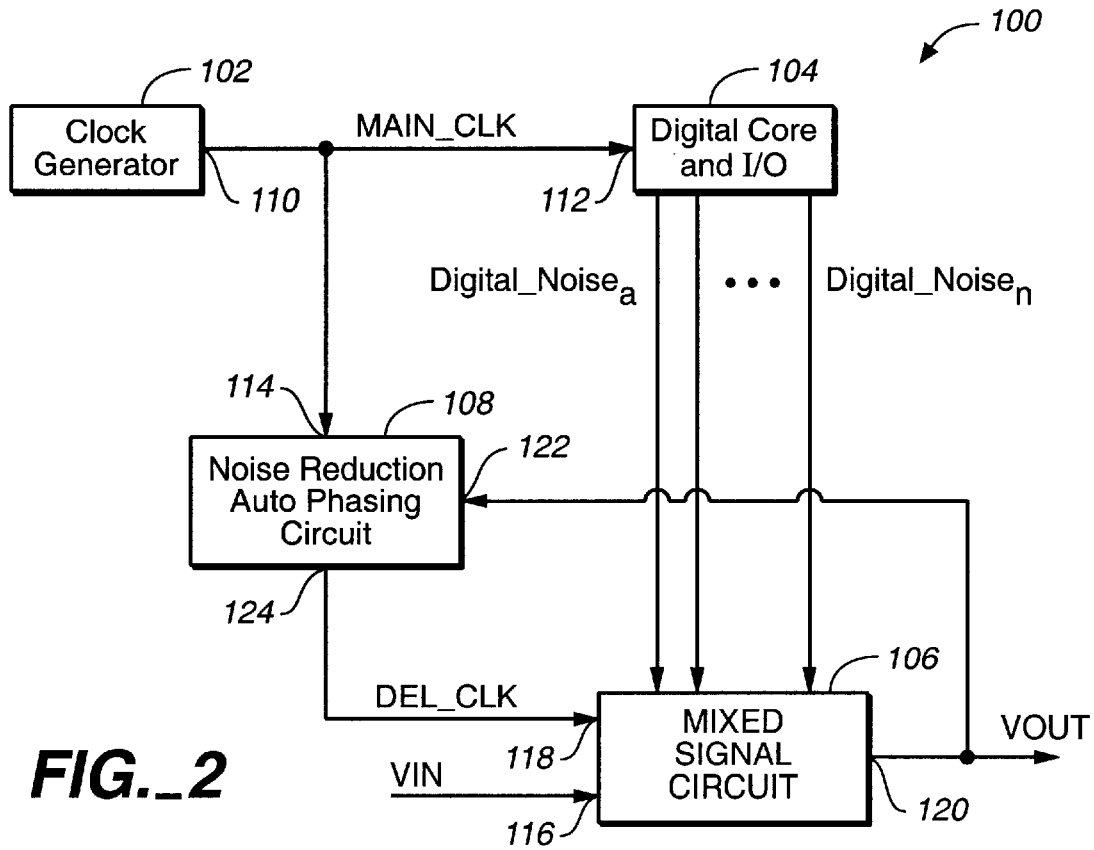
FIG._2
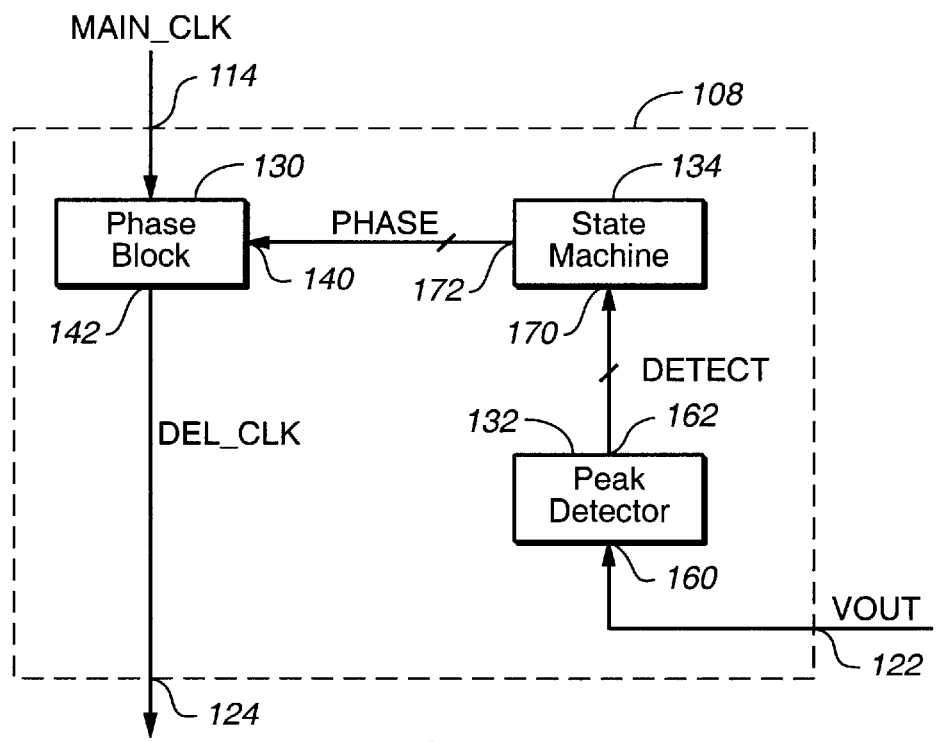
FIG._3

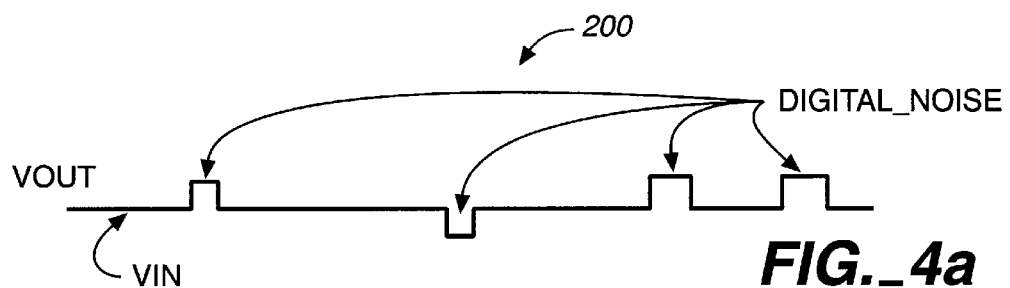
FIG._4a
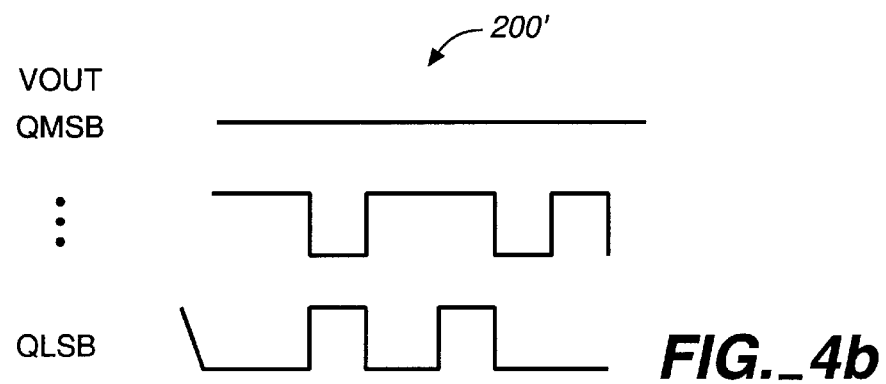
FIG._4b
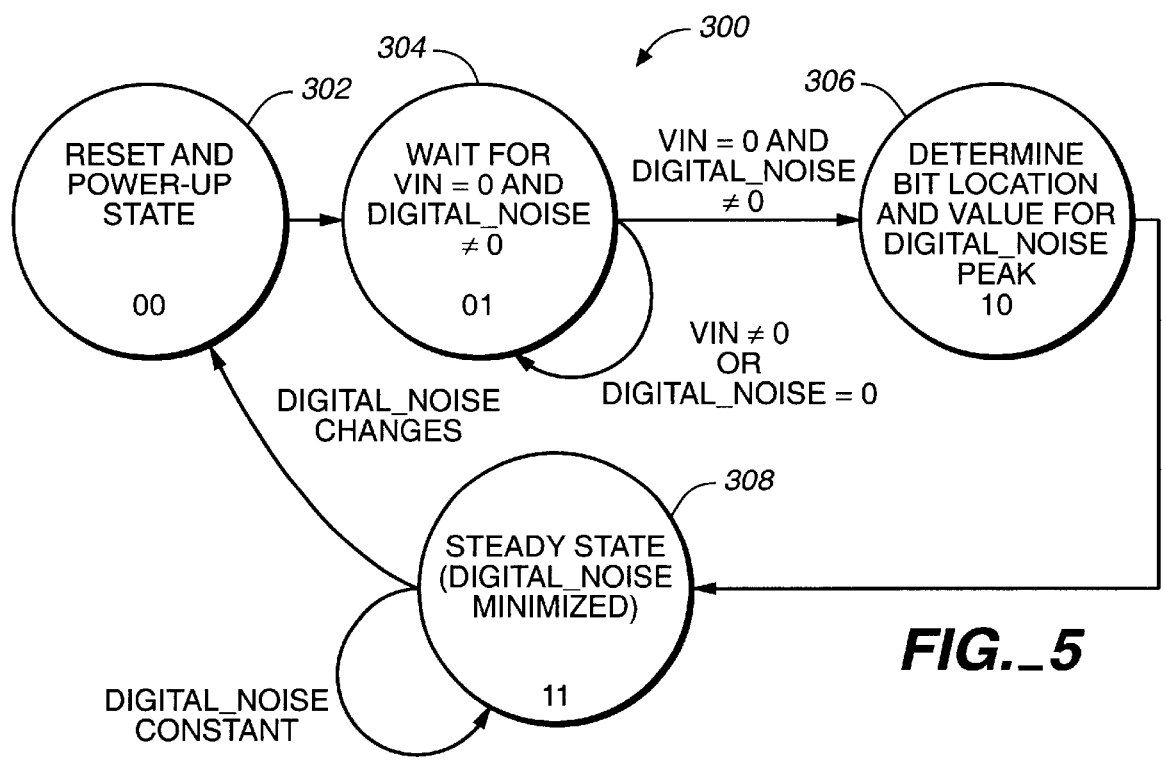
FIG._5

NOISE REDUCTION AUTO PHASING CIRCUIT FOR SWITCHED CAPACITOR CIRCUITS

FIELD OF THE INVENTION

The present invention relates to a method and/or architecture for analog signal processing generally and, more particularly, to a method and/or architecture for implementing noise reduction auto phasing sampled data systems in mixed signal integrated circuits.

BACKGROUND OF THE INVENTION

As integrated circuit integration density continues to increase and signal voltage swings continue to decrease (with decreasing power supply voltages), on-chip signal-to-noise ratio (SNR) is degrading. Noise on an integrated circuit (IC) degrades SNR. Digital noise is typically induced on mixed system ICs by digital core and I/O activity.

To reduce digital noise, a manual phasing adjustment between the digital clock and the analog sampled data system clock is made via inverter delays. Phasing adjustment is complete when minimum noise is coupled into the sampled data system. However, the phasing adjustment is found through trial and error. The manual method of noise reduction is redundant, tedious and does not incorporate all possible sources of on-chip noise or variations in IC processing. Therefore, the manual phase adjustment setting chosen does not maximize SNR.

It would be desirable to minimize digital noise coupling from an integrated circuit (IC) substrate, power supply, and/or routing into the signal path of a sampled data system on a mixed signal IC.

SUMMARY OF THE INVENTION

The present invention concerns an apparatus comprising a first circuit, a second circuit, and a third circuit. The first circuit may be configured to generate a control signal in response to an output signal. The control signal may comprise a peak value of the output signal. The second circuit may be configured to generate a phase adjustment signal in response to the control signal. The third circuit may be configured to generate a second clock signal in response to the phase adjustment signal and a first clock signal. The second clock signal may clock the output signal.

The objects, features and advantages of the present invention include providing a method and/or architecture for implementing a noise reduction auto phasing circuit for sampled data systems in mixed signal integrated circuits that may (i) automatically adjust a clock phase, (ii) adapt to different digital modes, (iii) reduce a number of digital noise signatures, (iv) eliminate manual characterization, (v) maximize signal-to-noise ratio, and/or (vi) accommodate wafer lot timing spreads.

BRIEF DESCRIPTION OF THE DRAWINGS

These and other objects, features and advantages of the present invention will be apparent from the following detailed description and the appended claims and drawings in which:

FIG. 1 is a timing diagram illustrating an operation of the present invention;

FIG. 2 is a block diagram illustrating a preferred embodiment of the present invention;

FIG. 3 is a detailed block diagram of the noise reduction circuit of FIG. 2;

FIGS. 4(a–b) are timing diagrams illustrating waveforms of the present invention; and FIG. 5 is a state diagram illustrating an operation of the present invention.

DETAILED DESCRIPTION OF THE PREFERRED EMBODIMENTS

The present invention is directed to a noise reduction auto phasing device for switched capacitor circuits. The present invention may be implemented for sampled data systems using analog-to-digital converters (ADCs), digital-to-analog converters (DACs), switched capacitor circuits (e.g., for signal processing), coders/decoders (CODECs) (e.g., for voice coders/decoders in cellular phones) or other applicable devices.

Referring to FIG. 1, a timing diagram 50 illustrating an operation of the present invention is shown. The timing diagram 50 may illustrate phasing adjustment of analog clocks with respect to a main system clock signal (e.g., MAIN_CLK) of an integrated circuit (IC). The clock signal MAIN_CLK may be used to generate internal clock signals for both analog and digital portions of the IC. However, on each transition of the clock signal MAIN_CLK, activity in the digital region (e.g., digital transactions) of the IC may occur in the form of toggling digital gates and/or toggling digital I/Os. The digital activity may inject and/or induce a noise signal (e.g., DIGITAL_NOISE) into the substrate, power supplies, power and/or chassis grounds, miscellaneous routes, etc. of the IC. The noise signal DIGITAL_NOISE may appear in analog signal paths of the IC. For example, the digital noise signal may appear on an input analog voltage (e.g., a "clean" signal, VIN) of the IC as a combined digital and analog ("dirty") output signal (e.g., VOUT). The clock signal MAIN_CLK may clock the signals VIN, DIGITAL_NOISE, and VOUT. The IC may have different values for the signal DIGITAL_NOISE (e.g., digital noise signatures) for each mode of operation.

For sampled data systems, the noise on the signal VOUT may degrade a signal-to-noise ratio (SNR) of the signal VOUT if the voltage signal VOUT is not sampled appropriately. The signal VOUT may be sampled with digital noise on clock transitions of an analog clock signal (e.g., ACKL1) at times 52a–52n and times 54a–54n. The clock signal ACLK1 may represent a buffered version of the clock signal MAIN_CLK. The clock signal ACLK1 may be a poor choice for a sampling clock. The voltage signal VOUT may be noise free when sampled using an analog clock signal (e.g., ACLK2) at times 56a–56n and times 58a–58n. The clock signal ACLK2 may represent a buffered and delayed version of the clock signal MAIN_CLK. The delay of the clock signal ACLK2 (e.g., T) may be equal to the time 52a–52n to the respective time 56a–56n. The clock signal ACLK2 may be a good choice for a sampling clock.

The timing diagram 50 may be a simplified version of a true mixed signal IC environment. Finding the correct delay value T for the clock signal ACLK2 may be a difficult task on a complex mixed signal IC. Additionally, more than one delay value T may be needed for the signal ACLK2, depending upon the activity of the digital portion of the IC. For example, the IC may have multiple digital noise signatures.

Referring to FIG. 2, a block diagram of a system (or circuit) 100 is shown in accordance with a preferred embodiment of the present invention. The circuit 100 may be a mixed system (e.g., analog and digital) IC. The circuit 100 generally comprises a clock generator block (or circuit) 102, a digital core and I/O block (or circuit) 104, a mixed signal circuit 106, and a noise reduction auto phasing block (or circuit) 108. The circuit 106 may contain analog-to-digital converters (ADCs), digital-to-analog converters (DACs), switched capacitor circuits (e.g., for signal processing), coders/decoders (CODECs) (e.g., for voice coders/decoders in cellular phones) or other applicable devices. The digital core and I/O circuit 104 may introduce (e.g., inject and/or induce) digital noise (e.g., the signal DIGITAL_NOISE) in the circuit 100, particularly in the mixed signal circuit 106. The coupling mechanism between the circuit 104 and the mixed signal circuit 106 generally comprises the substrate, power supplies, power and/or chassis grounds, miscellaneous routes, etc. of the IC and/or components thereof. The noise reduction circuit 108 may be configured to reduce the digital noise in the circuit 106.

The clock generator 102 may have an output 110 that may present the main system clock signal MAIN_CLK. The signal MAIN_CLK may be presented to an input 112 of the digital core and I/O circuit 104 and an input 114 of the noise reduction auto phasing circuit 108. The circuit 104 may have one or more outputs that may present (e.g., inject and/or induce) one or more versions of the digital noise signal DIGITAL_NOISE (e.g., DIGITAL_NOISEa-DIGITAL_NOISEn) to the mixed signal circuit 106. The circuit 104 may generate the signals DIGITAL_NOISEa-DIGITAL_NOISEn in response to the signal MAIN_CLK. The circuit 106 may have an input 116 that may receive the signal VIN, an input 118 that may receive a signal (e.g., DEL_CLK) and an output 120 that may present the signal VOUT. The signal DEL_CLK may be implemented as a buffered and delayed (e.g., adjusted) clock signal version of the signal MAIN_CLK. The signal DEL_CLK may function similarly to the signal ACLK2 (e.g., the signal DEL_CLK may sample the signal VOUT at one or more noise-free or minimum noise times). The circuit 106 may generate the signal VOUT in response to the signals VIN, DEL_CLK and DIGITAL_NOISE.

The noise reduction auto phasing circuit 108 may also have an input 122 that may receive the signal VOUT and an output 124 that may present the signal DEL_CLK. The signal VIN may be an analog signal. The signal VOUT may be an output sampled analog signal with digital noise (e.g., the signal DIGITAL_NOISE) (described in connection with FIG. 4a). In one example, the signal VOUT may be binary code representing digital noise content of a sampled analog signal (described in connection with FIG. 4b). Ideally, when the signal VIN is zero, the signal VOUT is generally zero. However, the signal VOUT may not be zero, since the digital noise signal DIGITAL_NOISE may be coupled on the "clean" signal VIN to produce the "dirty" signal VOUT.

Referring to FIG. 3, the noise reduction circuit 108 is shown comprising a phase block (or circuit) 130, a peak detector block (or circuit) 132 and a state machine 134. The phase circuit 130 may receive the clock signal MAIN_CLK. The phase circuit 130 may also have an input 140 that may receive a signal (e.g., PHASE) and an output 142 that may present the signal DEL_CLK. The signal PHASE may be a control signal. The circuit 130 may be configured to generate the signal DEL_CLK in response to the signals MAIN_CLK and PHASE.

The peak detector 132 may have an input 160 that may receive the signal VOUT. The peak detector 132 may also have an output 162 that may present a signal (e.g., DETECT). The signal DETECT may be a single-bit or a multi-bit digital signal. The state machine 134 may have an input 170 that may receive the signal DETECT. The state machine 134 may have an output 172 that may present the signal PHASE to the input 140 of the phase block 130. The signal PHASE may be implemented as a phase adjustment signal. The signal PHASE may be a single-bit or multi-bit digital signal. The state machine 134 may implement memory (not shown) configured to store values of the signal DETECT and respective values of the signal PHASE. The state machine 134 may be configured to generate the signal PHASE in response to the signal DETECT. The peak detector 132 may be implemented with analog-to-digital conversion circuitry (not shown) to generate the digital signal DETECT in response to the signal VOUT.

The phase block 130 may be implemented as a number of buffers (not shown) that may accumulate up to 1/MAIN_CLK seconds of delay (or one cycle of delay of the signal MAIN_CLK). The phase block 130 may (i) receive the main clock signal MAIN_CLK and the signal PHASE and (ii) generate the buffered and delayed clock signal DEL_CLK. The clock signal DEL_CLK may be similar to the clock signal ACLK2 of the timing diagram 50. The amount of delay of the clock signal DEL_CLK may be automatically controlled by the phase adjustment signal PHASE via a feedback path to the circuit 106 comprising the circuits 130, 132 and 134. The phase block 130 may drive the clock signal DEL_CLK of the mixed signal circuit 106. The circuit 130 may be configured to generate the signal DEL_CLK in response to the signals MAIN_CLK and PHASE. The signal DEL_CLK may allow the mixed signal circuit 106 to reduce digital noise (e.g., the DIGITAL_NOISE component of the signal VOUT).

The peak detector 132 may be configured to capture the peak digital noise output of the mixed signal circuit 106 via the signal VOUT. The peak detector 132 may be configured to perform analog-to-digital conversion. The peak detector 132 may convert the peak output of the signal VOUT to a digital peak value signal (e.g., the signal DETECT). The signal DETECT may be a control signal generated in response to the signal VOUT. The signal DETECT may be a digital signal comprising one or more bits. The peak value DETECT may then be stored in an internal memory (not shown, within the state machine 134) along with the respective phase adjust setting signal PHASE. The state machine 134 may increment the phase adjustment signal PHASE in response to the signal DETECT and repeat the adjustment and measurement process until the signal VOUT is substantially noise-free or the signal DIGITAL_NOISE is minimized. In one example, the reduction and/or level of digital noise (e.g., the signal DIGITAL_NOISE) on the signal VOUT that is noise-free may be user defined to meet the design criteria of a particular application. In another example the noise reduction and/or level may be fixed. The state machine 134 may also be configured to dynamically evaluate the stored values DETECT and choose the phase adjust setting PHASE corresponding to the minimum peak digital noise value of VOUT setting.

Referring to FIG. 4a, a timing diagram 200 illustrating an example waveform of the signal VOUT is shown. The waveform 200 may be an analog representation of the signal VOUT when the signal VIN is zero. When the signal VIN is zero, the signal VOUT generally comprises the digital noise signal DIGITAL_NOISE.

Referring to FIG. 4b, a timing diagram 200' illustrating another example waveform of the signal VOUT is shown. The waveform 200' may be a binary code digital representation (e.g., Q) of the signal VOUT when the signal VIN is zero. The signal Q may comprise least significant bit (e.g., $Q_{LSB}$) through most significant bit (e.g., $Q_{MSB}$) components. When the signal VIN is zero, the signal Q generally comprises the digital noise signal DIGITAL_NOISE.

Referring to FIG. 5, a state diagram 300 illustrating an operation topology of the state machine 134 is shown. The state machine 134 generally has four states (e.g., 00, 01, 10, and 11 or 302, 304, 306 and 308, respectively). However, any number of states may be implemented accordingly to meet the design criteria of a particular application.

The state machine 134 may have an initial reset and power-up state (e.g., the state 00 or 302). All of the circuitry (e.g., registers, flip-flops, etc.) (not shown) of the circuit 134 may be preset/reset. The circuit 134 generally monitors the signal VOUT (e.g., the combination of the signals VIN and DIGITAL_NOISE) continuously (e.g., the "wait" state 01 or 304).

When the signal VIN is not equal to zero or the signal DIGITAL_NOISE equals zero, the state machine 134 generally moves to or remains in the state 01 (or 304). The zero value for the signals VIN and DIGITAL_NOISE may be a user defined level or value that may be set to meet the design criteria of a particular application. In one example, the zero value for the signals VIN and DIGITAL_NOISE may be the same value. However, the zero value for the signals VIN and DIGITAL_NOISE may be implemented at different values or levels. The state 01 (or 304) may be an idle state. In one example, the signal VIN may be forced to zero by shorting the input 116 of the circuit 106 to a supply ground. The signal DIGITAL_NOISE is generally not equal to zero after a number of cycles of the signal MAIN_CLK (e.g., x cycles). In one example, the state machine 134 may be configured to move to the state 01 (or 304) after x cycles of the signal MAIN_CLK.

When the signal VIN equals zero and the signal DIGITAL_NOISE is not equal to zero, the state machine 134 may move to the state 10 (or 306). When the state machine 134 is in the state 10, the peak detector 132 may first measure the signal DIGITAL_NOISE for a particular value of the signal PHASE (e.g., for a specific delay of the signal DEL_CLK relative to the signal MAIN_CLK or a specific delay tap (not shown) in the circuit 132). The value of the signal DIGITAL_NOISE and the delay of the signal PHASE (e.g., the delay tap location) may be stored in a memory (not shown) in the circuit 134 (e.g., as the signal DETECT).

The circuit 108 may be configured to adjust the signal PHASE by a predetermined increment (or delay) and measure and store the next value of the signal DETECT. The amount of the predetermined increment of the signal PHASE may be any appropriate value to meet the design criteria of a particular application. The circuit 108 may be configured to repeat the steps of incrementing the signal PHASE and measuring and storing the signal DETECT for a predetermined number of cycles of the signal MAIN_CLK. The predetermined number of cycles of the signal MAIN_CLK is generally determined in response to the frequency of the signal MAIN_CLK and the increment of the signal PHASE. However, any number of cycles of the signal MAIN_CLK may be implemented accordingly to meet the design criteria of a particular application.

When the circuit 108 has incremented the signal PHASE through the predetermined number of measurements of the signal DIGITAL_NOISE (e.g., determined the full range of values of the signal DETECT), the state machine 134 generally moves to an operating mode where the minimum peak value of the signal DIGITAL_NOISE is generated (e.g., the state 11 or 308). The state 11 is generally determined via the stored value of the signal DETECT and the respective value of the signal PHASE (e.g., the circuit 108 may be configured to adjust the value of the delay of the signal DEL_CLK in response to the value of the signal PHASE that results in the minimum peak value of the signal DIGITAL_NOISE). The minimum peak value of the signal DIGITAL_NOISE generally corresponds to a particular bit location in the signal Q.

The state 11 may be a steady-state condition. However, when the circuit 100 is operated in a new mode (e.g., different frequency range, start-up, reset, etc.), the signal DIGITAL_NOISE generally changes and the steps corresponding to the states 00 through 11 may be repeated.

Alternative embodiments of the noise reduction circuit 108 may implement completely analog, digital, or a mix of peak detectors and/or comparison routines to find the minimal noise settings. However, the circuits 106 and 108 generally implement a feedback loop to determine a minimal noise setting. Furthermore, alternative embodiments may also delay the digital clock signal (e.g., the signal MAIN_CLK or a derivative of the signal MAIN_CLK implemented in the circuit 104 (not shown)) rather than the analog clock signal DEL_CLK to achieve the digital noise reduction.

The mixed signal IC 100 may operate with full digital activity and produce steady state digital noise as shown in the timing diagram 50 of FIG. 1. The IC 100 may implement the main clock signal MAIN_CLK to time the digital section (e.g., the circuit 104), the mixed signal section (e.g., the circuit 106), and the noise reduction auto phasing circuit 108. However, the digital core and I/O circuit 104 may create noise in the substrate, supplies and/or routes of the circuit 100 (e.g., the circuit 106). It is therefore desirable to determine the optimal phasing between clocking (via the signal MAIN_CLK) of the digital section 104 and the analog section 106 (via the signal DEL_CLK) that may result in minimal digital noise coupling.

The circuit 100 may provide automatic operation and adaptive operation. The circuit 100 may operate automatically instead of needing manual input as in conventional approaches (e.g., manual characterization in the lab is not needed). Since the circuit 108 automatically determines the best phase setting for the signal DEL_CLK, no additional tuning may be needed to tune the IC 100 to an optimum SNR. Furthermore, since the noise reduction operation of the circuit 108 is a type of calibration, variation in timings from wafer lot spreads may be taken into account. For a particular implementation, the state machine 134 may be modified to account for different phase settings, where there may be several different digital modes that each may produce significant and different digital noise signatures. Therefore, the circuit 100 may be made adaptive (e.g., more than one setting may be implemented depending upon the activity of the digital region 104 to insure the SNR of the signal VOUT is maximized for numerous conditions).

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a control signal in response to an output signal, wherein said control signal comprises a peak value of said output signal;
    a second circuit configured to generate a phase adjustment signal in response to said control signal;
    a third circuit configured to receive a first clock signal and generate a second clock signal in response to said phase adjustment signal and said first clock signal; and a fourth circuit configured to generate said output signal in response to said second clock signal.

2. The apparatus according to claim 1, wherein said fourth circuit is further configured to generate said output signal in response to an input signal and one or more digital noise signals.

3. The apparatus according to claim 1, wherein said output signal comprises an analog signal and one or more digital noise signals.

4. The apparatus according to claim 1, wherein a phase of said second clock signal is adjusted to reduce digital noise of said output signal due to digital transactions.

5. The apparatus according to claim 1, wherein said apparatus is configured to reduce digital noise of said output signal for one or more digital noise signatures.

6. The apparatus according to claim 5, wherein said apparatus is further configured to provide one or more phase settings to said second clock signal in response to said digital noise signatures.

7. The apparatus according to claim 1, wherein said apparatus comprises a noise reduction auto phase circuit implemented in mixed signal circuits selected from the group consisting of switched capacitor circuits, analog-to-digital converters, digital-to-analog converters, and coder/decoder circuits.

8. The apparatus according to claim 1, wherein said first circuit comprises a peak detector configured to convert an analog peak value of said output signal to said control signal and said control signal comprises a digital signal.

9. The apparatus according to claim 1, wherein said second circuit comprises a state machine configured to store said phase adjustment signal and said control signal.

10. The apparatus according to claim 9, wherein said state machine is configured to store one or more of said phase adjustment signals and one or more of said control signals.

11. The apparatus according to claim 2, wherein said apparatus comprises a feedback loop.

12. An apparatus according to claim 1, wherein said third circuit comprises a one or more buffers configured to accumulate a phase delay up to an inverse of said first clock signal and said second clock signal comprises said first clock signal adjusted by said phase delay.

13. The apparatus according to claim 3, wherein said analog signal and said digital noise signals are generated in response to said first clock signal.

14. The apparatus according to claim 1, wherein said first circuit comprises a peak detector selected from the group consisting of analog circuits, digital circuits, mixed analog/digital circuits, and comparison routines.

15. An apparatus for reducing digital noise on an output signal comprising:
   means for generating a control signal in response to said output signal, wherein said control signal comprises a peak value of said output signal;
   means for generating a phase adjustment signal in response to said control signal;
   means for generating an adjusted clock signal in response to a first clock signal and said phase adjustment signal; and
   means for generating said output signal in response to said adjusted clock signal.

16. A method of reducing digital noise on an output signal comprising the steps of:
   (A) generating a control signal in response to said output signal, wherein said control signal comprises a peak value of said output signal;
   (B) generating a phase adjustment signal in response to said control signal; and
   (C) generating an adjusted clock signal in response to a first clock signal and said phase adjustment signal; and
   (D) generating said output signal in response to said adjusted clock signal.

17. The method according to claim 16, wherein step (D) further comprises generating said output signal in response to an analog signal and said digital noise.

18. The method according to claim 16, wherein said method further comprises:
   reducing said digital noise for one o r more digital noise signatures.

19. The method according to claim 18, wherein said method further comprises:
   providing one or more phase settings to said adjusted clock signal in response to said digital noise signatures.

20. The method according to claim 16, wherein said method further comprises the step of:
   storing one or more of said phase adjustment signals and said control signals.

* * * * *